US011069721B2

(12) United States Patent
Jung et al.

(10) Patent No.: US 11,069,721 B2
(45) Date of Patent: Jul. 20, 2021

(54) DISPLAY DEVICE AND METHOD OF MANUFACTURING THE SAME

(71) Applicant: LG Display Co., Ltd., Seoul (KR)

(72) Inventors: Won-June Jung, Seoul (KR); Sang-Moo Park, Goyang-si (KR); Seok-Hyun Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 13 days.

(21) Appl. No.: 16/560,208

(22) Filed: Sep. 4, 2019

(65) Prior Publication Data
US 2020/0098795 A1  Mar. 26, 2020

(30) Foreign Application Priority Data

Sep. 20, 2018  (KR) .................. 10-2018-0113232

(51) Int. Cl.
| H01L 27/12 | (2006.01) |
| H01L 23/528 | (2006.01) |
| G02F 1/1362 | (2006.01) |
| H01L 27/32 | (2006.01) |
| G02F 1/1345 | (2006.01) |
| H01L 23/60 | (2006.01) |

(Continued)

(52) U.S. Cl.
CPC ........ H01L 27/1244 (2013.01); H01L 23/528 (2013.01); H01L 23/53228 (2013.01); H01L 27/1288 (2013.01); G02F 1/13452 (2013.01); G02F 1/136286 (2013.01); G02F 1/136295 (2021.01); H01L 23/60 (2013.01); H01L 25/18 (2013.01); H01L 27/1292 (2013.01); H01L 27/3223 (2013.01); H01L 27/3276 (2013.01); H01L 27/3288 (2013.01); H01L 29/78633 (2013.01); H01L 2227/323 (2013.01)

(58) Field of Classification Search
CPC .......... H01L 27/1244; H01L 23/53228; H01L 23/528; H01L 27/1288; H01L 25/18; H01L 27/3276; H01L 27/3223; H01L 2227/323; H01L 27/3288; H01L 23/60; H01L 27/1292; H01L 29/78633; G02F 1/136286; G02F 1/13452; G02F 2001/136295; G02F 1/136295
See application file for complete search history.

(56) References Cited

U.S. PATENT DOCUMENTS

2013/0335397 A1* 12/2013 Kim .................. G09G 3/006
345/212
2017/0364194 A1* 12/2017 Jang .................... H01L 27/3262

* cited by examiner

Primary Examiner — Steven H Loke
Assistant Examiner — Juanita B Rhodes
(74) Attorney, Agent, or Firm — Morgan, Lewis & Bockius LLP

(57) ABSTRACT

Disclosed are a display device for preventing loss of line patterns and a method of manufacturing the display device. The display device includes a substrate having an active area, a non-active area, and a pad portion formed at one side of the non-active area, printed circuit films disposed in the pad portion so as to be spaced a first distance apart from an edge of the substrate in a first direction and to be spaced apart from each other in a second direction that intersects the first direction, a first-layer line and a second-layer line disposed within the first distance between the printed circuit films and the edge of the substrate so as to be spaced apart from each other in the first direction, and island-shaped dummy patterns disposed in the same layer as the second-layer line in a region between two adjacent ones of the printed circuit films.

20 Claims, 12 Drawing Sheets

(51) Int. Cl.
*H01L 23/532* (2006.01)
*H01L 25/18* (2006.01)
*H01L 29/786* (2006.01)

FIG. 6A
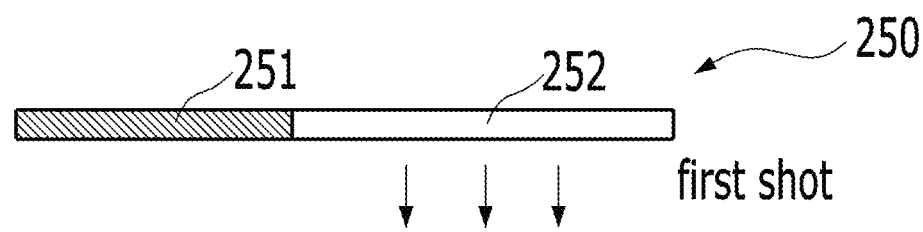
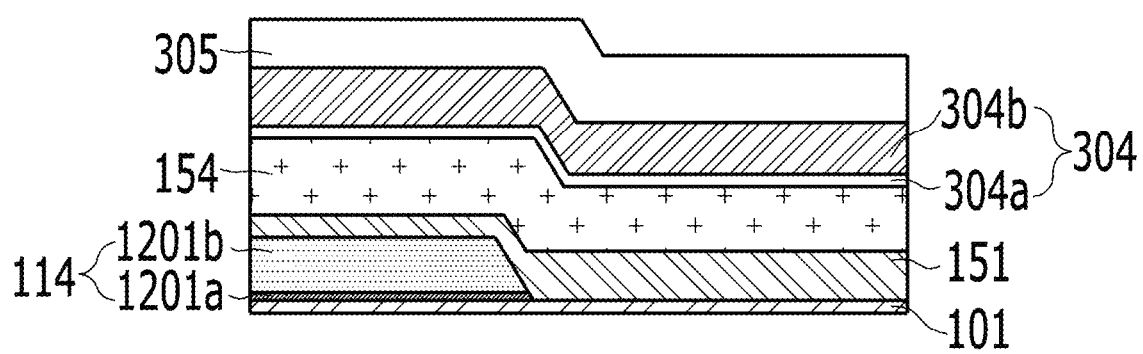

DISPLAY DEVICE AND METHOD OF MANUFACTURING THE SAME

This application claims the benefit of Korean Patent Application No. 10-2018-0113232, filed on Sep. 20, 2018, which is hereby incorporated by reference as if fully set forth herein.

BACKGROUND

Technical Field

The present disclosure relates to a display device, and more particularly to a display device, which includes dummy patterns formed in a region that does not overlap a printed circuit film, thereby preventing loss of patterns in an exposure boundary region, and to a method of manufacturing the display device.

Discussion of the Related Art

With the development of information technology, the market for display devices, used as a connection medium between a user and information, is growing. Thus, the use of display devices, such as organic light-emitting display (OLED) devices, liquid crystal display (LCD) devices, and plasma display panel (PDP) devices, is increasing.

The aforementioned display devices include a display panel including a plurality of subpixels arranged in a matrix form and a driving unit for driving the display panel. The driving unit includes a scan driver for supplying a scan signal (or a gate signal) to the display panel and a data driver for supplying a data signal to the display panel.

An active area in the display panel, which performs a display function, includes a plurality of subpixels, and each subpixel includes a thin-film transistor for controlling on/off operation and gradation of the corresponding subpixel.

In the aforementioned display devices, when a scan signal and a data signal are supplied to subpixels arranged in a matrix form via scan lines (gate lines) and data lines disposed so as to intersect each other, the selected subpixels are turned on so that a light-emitting diode provided in each subpixel emits light or light transmitted from below a substrate passes through the subpixel, thereby displaying an image.

Demand has increased for large-area display devices suitable for TVs, screens, or the like. In general, multiple layers are provided in display devices, and masks are required for layers that need to be patterned.

In a general display device, a mother substrate is provided, a plurality of panel areas is defined in the mother substrate, and an exposure process is performed for each panel area using a mask. In this manner, each layer is patterned. However, in the exposure process using this scan method, light leakage occurs at a boundary region between the previous exposure process and the subsequent exposure process, and loss of a pattern occurs at the exposure boundary region.

A line for which a pattern is lost is incapable of realizing signal transmission therethrough, and is thus determined to be defective.

SUMMARY

Accordingly, embodiments of the present disclosure are directed to a display device and a method of manufacturing the same that substantially obviate one or more problems due to limitations and disadvantages of the related art.

An aspect of the present disclosure is to provide a display device, which includes dummy patterns formed in a region that does not overlap a printed circuit film, thereby preventing loss of patterns in an exposure boundary region, and a method of manufacturing the display device.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a display device includes dummy patterns formed near a region in which a printed circuit film including a copper thin film is disposed, thereby preventing loss of patterns due to light leakage in an exposure boundary region and enabling stable formation of signal lines.

In one aspect, a display device comprises a substrate having an active area, a non-active area formed around the active area, and a pad portion formed at one side of the non-active area, a plurality of printed circuit films disposed in the pad portion, each of the printed circuit films having a drive IC, the printed circuit films being spaced a first distance apart from an edge of the substrate in a first direction and being spaced apart from each other at regular intervals in a second direction that intersects the first direction, a first-layer line and a second-layer line disposed within the first distance between the printed circuit films and the edge of the substrate so as to be spaced apart from each other in the first direction, and a plurality of dummy patterns disposed in the same layer as the second-layer line in a region between two adjacent ones of the printed circuit films, the dummy patterns having an island shape.

The dummy patterns may be disposed closer to the edge of the substrate than the printed circuit films or may be in contact with the edge of the substrate without overlapping the printed circuit films.

The display device may further include a first overlapping pattern disposed in the same layer as the second-layer line in the pad portion, the first overlapping pattern partially overlapping the first-layer line.

The display device may further include a first connection pattern disposed in the same layer as the second-layer line in the pad portion, the first connection pattern partially overlapping and being connected to the first-layer line.

The display device may further include an insulation film disposed between the first-layer line and the second-layer line.

The first-layer line may be disposed under the insulation film, and the dummy patterns may be disposed on the insulation film.

The first-layer line may include copper (Cu) and may have a thickness of 6000 Å or greater.

The display device may further include a plurality of gate lines and a plurality of data lines disposed in the active area so as to intersect each other, and the first-layer line and the second-layer line may be electrically connected to the data lines.

The dummy patterns may be disposed at a lower position than the first overlapping pattern.

The dummy patterns may have a larger area than the first overlapping pattern.

In another aspect, a method of manufacturing a display device comprises defining unit panel areas on a mother substrate so as to be spaced apart from each other, each of the unit panel areas having an active area, a non-active area formed around the active area, and a pad portion formed at one side of the non-active area, forming a first-layer line in the pad portion in a first direction that intersects an edge of each of the unit panel areas, forming a second-layer line in the first direction that intersects the edge of each of the unit panel areas so as to be spaced apart from the first-layer line, forming a first connection pattern in the same layer as the second-layer line so as to partially overlap the first-layer line, and forming a plurality of first dummy patterns near the edge of each of the unit panel areas so as not to overlap either the first-layer line or the second-layer line.

The method may further include forming a first overlapping pattern in the same layer as the second-layer line in the pad portion so as to partially overlap the first-layer line in the forming the first connection pattern.

The first connection pattern may be disposed adjacent to the pad portion in the external area of each of the unit panel areas.

The method may further include, between the forming the first-layer line and the forming the second-layer line, forming a plurality of gate lines in a second direction, which intersects the first direction, in the active area of each of the unit panel areas.

The method may further include forming a plurality of data lines in the active area in the first direction in the forming the first-layer line or the forming the second-layer line.

The method may further include forming a shorting bar line in a region between two adjacent ones of the unit panel areas so as to be adjacent to the pad portion in the forming the first-layer line.

The first-layer line and the second-layer line may be connected at one sides thereof to the data lines via pad electrodes and link lines in the mother substrate, and may be connected at opposite sides thereof to the shorting bar line across the edge of each of the unit panel areas.

The method may further include forming second dummy patterns so as to overlap the shorting bar line in the forming the second-layer line.

The method may further include scribing the mother substrate in order to define each of the unit panel areas, and bonding a plurality of printed circuit films to the pad portion of each of the unit panel areas so as to overlap the pad electrodes and to be spaced a first distance apart from the edge of each of the unit panel areas in the first direction, each of the printed circuit films having a drive IC, the printed circuit films being spaced apart from each other at regular intervals in a second direction that intersects the first direction.

The forming the second-layer line may include depositing a second-layer-line-forming material, coating a photosensitive film thereon, sequentially performing an exposure process on the photosensitive film for the respective unit panel areas using a mask, forming a photosensitive film pattern by developing the photosensitive film, and forming the second-layer line, the first connection pattern, the first dummy patterns and the second dummy patterns by removing the second-layer-line-forming material that is exposed through the photosensitive film pattern.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings:

FIGS. 6A and 6B are cross-sectional views illustrating a process of exposing second-layer lines when a display device according to a comparative example is manufactured;

DETAILED DESCRIPTION

Figure 1:
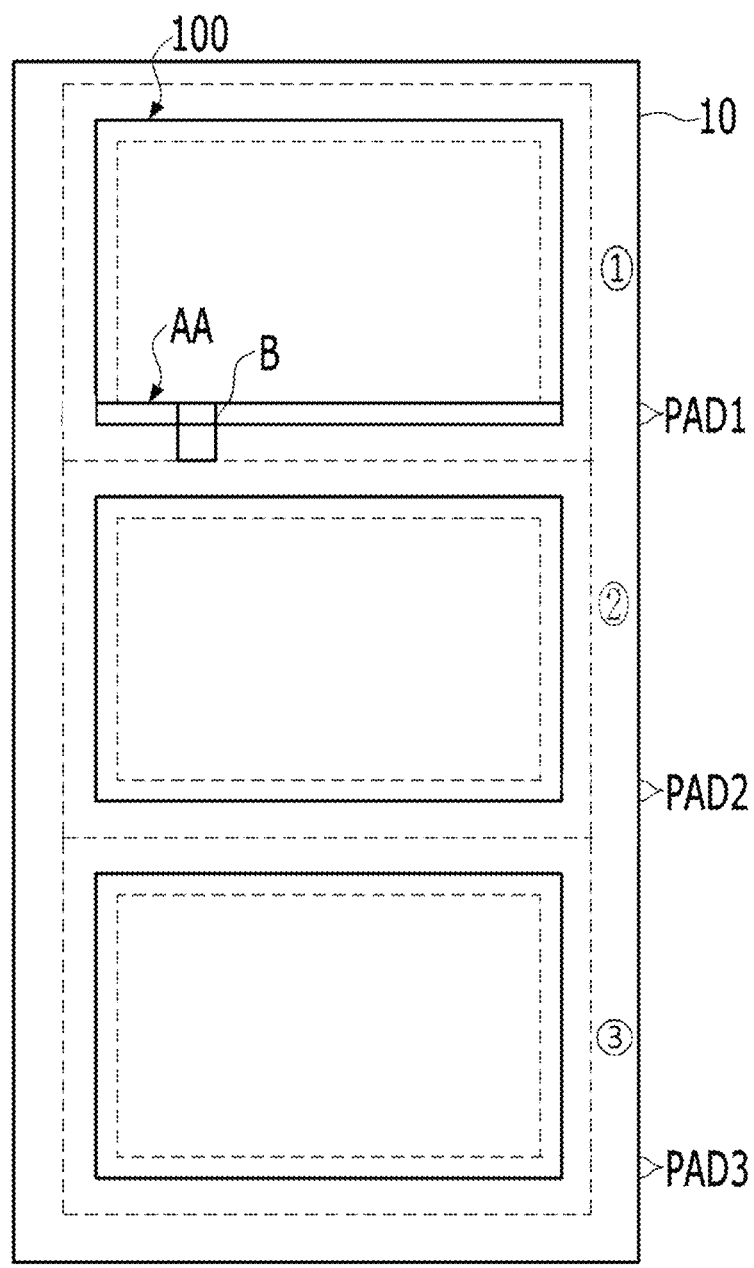
FIG. 1 is a plan view of a mother substrate on which a plurality of unit panels of a display device according to the present disclosure is provided.

Reference will now be made in detail to the preferred embodiments of the present invention, examples of which are illustrated in the accompanying drawings. The same reference numerals used throughout the specification refer to the same or like parts. In the following description of the present invention, a detailed description of known functions and configurations incorporated herein will be omitted when it may make the subject matter of the present invention rather unclear. Names of components used in the following description are selected in consideration of facility of specification preparation. Thus, the names of the components may be different from names of components used in a real product.

In the drawings for explaining the exemplary embodiments of the present invention, for example, the illustrated shape, size, ratio, angle, and number are given by way of example, and thus are not limited to the disclosure of the present invention. Throughout the present specification, the same reference numerals designate the same constituent elements. In addition, in the following description of the present invention, a detailed description of known functions and configurations incorporated herein will be omitted when it may make the subject matter of the present invention rather unclear. The terms "comprises", "includes", and/or "has", used in this specification, do not preclude the presence or addition of other elements unless used along with the term "only". The singular forms are intended to include the plural forms as well, unless the context clearly indicates otherwise.

In the interpretation of constituent elements included in the various embodiments of the present invention, the constituent elements are interpreted as including an error range even if there is no explicit description thereof.

In the description of the various embodiments of the present invention, when describing positional relationships, for example, when the positional relationship between two parts is described using "on", "above", "below", "next to", or the like, one or more other parts may be located between the two parts unless the term "directly" or "closely" is used.

In the description of the various embodiments of the present invention, when describing temporal relationships, for example, when the temporal relationship between two actions is described using "after", "subsequently", "next", "before", or the like, the actions may not occur in succession unless the term "directly" or "just" is used therewith.

In the description of the various embodiments of the present invention, although terms such as, for example, "first" and "second" may be used to describe various elements, these terms are merely used to distinguish the same or similar elements from each other. Therefore, in the present specification, an element indicated by "first" may be the same as an element indicated by "second" without exceeding the technical scope of the present invention, unless otherwise mentioned.

The respective features of the various embodiments of the present invention may be partially or wholly coupled to and combined with each other, and various technical linkages and modes of operation thereof are possible. These various embodiments may be performed independently of each other, or may be performed in association with each other.

FIG. 1 is a plan view illustrating a mother substrate including a plurality of unit panel areas in a display device according to the present disclosure.

As illustrated in FIG. 1, a plurality of unit panel areas 100 is defined in a mother substrate 10, and each unit panel area 100 includes a plurality of lines, a thin-film transistor, a storage capacitor, and a light-emitting diode.

Since the unit panel areas 100 have the same shape and are repeatedly arranged, patterning of layers is performed in a manner such that a mask corresponding to each unit panel area 100 is prepared for each layer that needs to be patterned on the mother substrate 10, and a stage, on which the mask or the mother substrate 10 is located, is moved in a scanning manner in order to change an exposure position, thereby forming patterned layers on the mother substrate 10.

As illustrated in FIG. 1, in the case in which three unit panel areas 100 are arranged in a Y-axis direction on the mother substrate 10, the regions 1, 2, and 3 each including the unit panel area 100, undergo an exposure process in that order. Here, pad portions PAD1 and PAD2 of the unit panel areas 100 in the previous row are adjacent to non-pad portions NPAD2 and NPAD3 of the unit panel areas 100 in the subsequent row.

In this case, the unit panel areas 100 are not contiguous with each other on the mother substrate 10, but are arranged so as to be spaced apart from each other. The reason for this is to discharge static elasticity generated during the process by disposing shorting bar lines and static elasticity discharge elements, which are connected to the lines in the unit panel areas 100, in the region between the unit panel areas 100.

Shorting bar lines 110a and static electricity discharge elements ESD1, ESD2, ESD3 and ESD4 may extend from the edges of the neighboring pad portions PAD1, PAD2 and PAD3 to the outside of the unit panel areas 100, and may be disposed between the unit panel areas 100 and the non-pad portions NPAD2 and NPAD3 of the unit panel areas 100 in the subsequent row.

When multiple layers are completely formed in each unit panel area 100 on the mother substrate 10 through a photo process including exposure and developing processes, the unit panel areas 100 are scribed so as to be separated from each other. In the scribing process, the shorting bar lines 110a and the static elasticity discharge elements ESD1, ESD2, ESD3 and ESD4, which are disposed outside the unit panel areas 100, are separated from the unit panel areas 100. The scribing process is performed using the edges of the unit panel areas 100 as scribing lines.

The display device and the method of manufacturing the same are proposed to prevent pattern loss at the edge of the pad portion, which may be caused between the previous exposure shot and the subsequent exposure shot. To this end, the present invention is characterized in that first dummy patterns 140 and the second dummy patterns 141 (refer to FIG. 3) are formed near the edge of the pad portion. The first dummy patterns 140 and the second dummy patterns 141 are formed in the same layer as the lines disposed in the active area AA, particularly in the same layer as the lines formed subsequently to a light-shielding layer LS located at the lowermost position.

Figure 2:
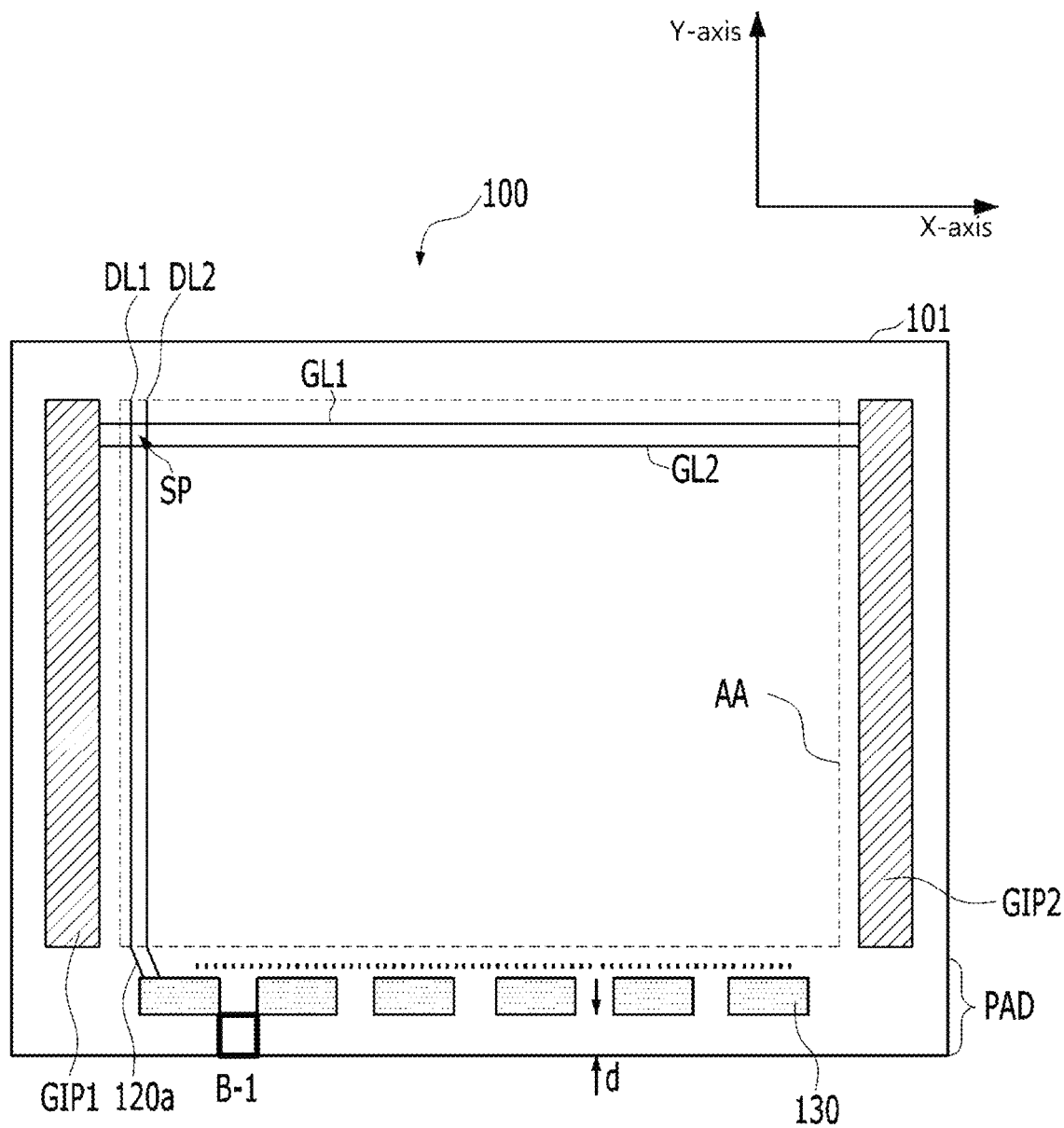
FIG. 2 is a plan view of the unit panel illustrated in FIG. 1.
Figure 3:
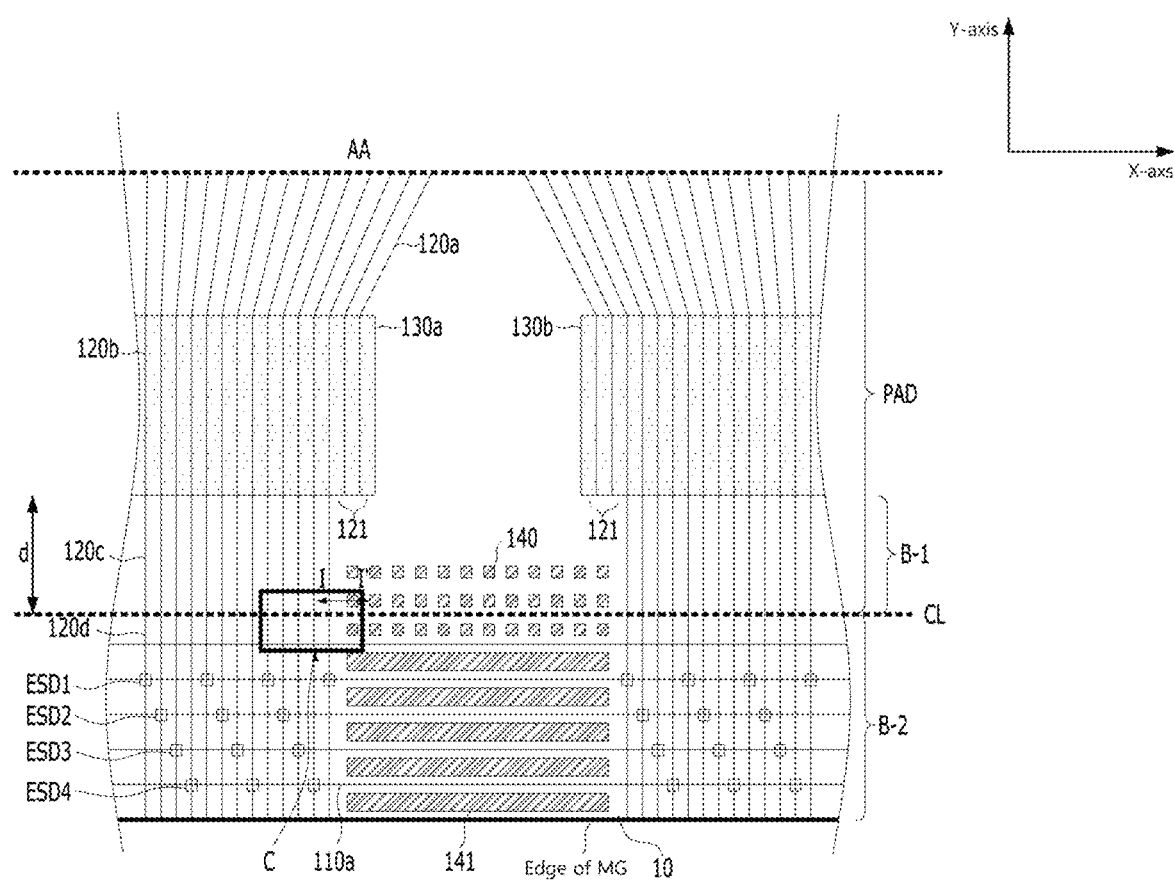
FIG. 3 is an enlarged plan view of region illustrated in FIG. 1.
Figure 4:
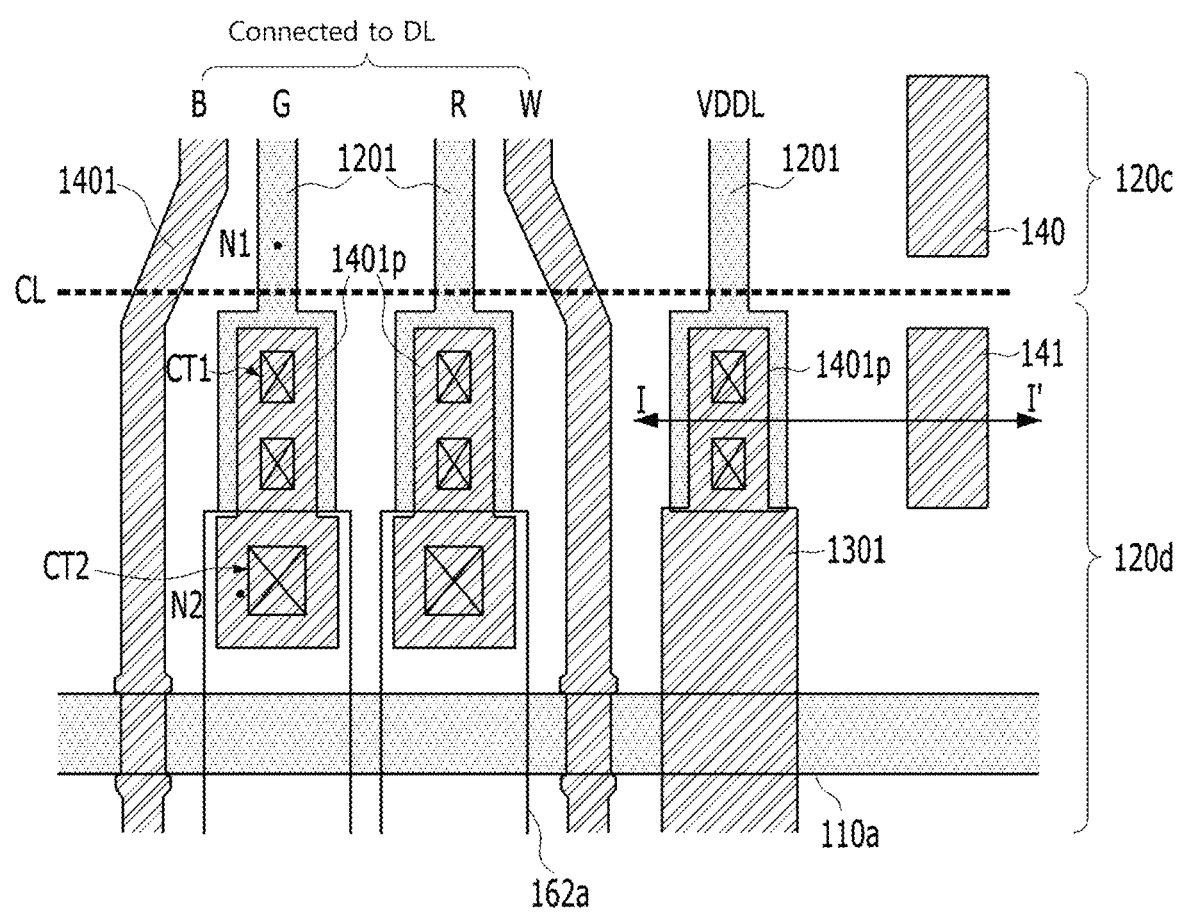
FIG. 4 is an enlarged plan view of region C illustrated in FIG. 3.
Figure 5:
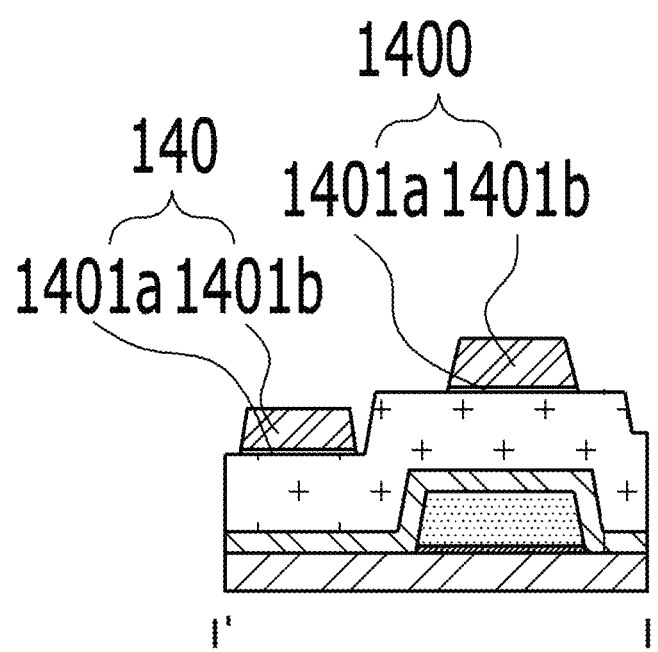
FIG. 5 is a cross-sectional view taken along line I-I' in FIG. 4.

FIG. 2 is a plan view illustrating the unit panel areas 100 illustrated in FIG. 1, FIG. 3 is an enlarged plan view illustrating region B in FIG. 1, FIG. 4 is an enlarged plan view illustrating region C in FIG. 3, and FIG. 5 is a cross-sectional view taken along line I-I' in FIG. 4.

Referring to FIG. 2, each of the unit panel areas 100 is obtained by scribing the unit panel areas 100 on the mother substrate 10 illustrated in FIG. 1 so that the unit panel areas 100 are separated from each other.

As illustrated in FIGS. 2 and 3, the unit panel areas 100 according to the present invention includes a substrate 101, which has an active area AA, a non-active area formed around the active area AA and a pad portion PAD formed at one side of the non-active area, a plurality of printed circuit films 130 disposed in the pad portion PAD, each of which has a drive Integrated Circuit IC (not illustrated) and which are spaced a first distance d apart from the edge of the unit panel areas 100 in a first direction (y-axis direction) and are spaced apart from each other at regular intervals in a second direction (x-axis direction), which intersects the first direction, first connection lines 120c, which are disposed within the first distance d between the printed circuit films 130 and the edge of the unit panel areas 100 so as to be adjacent to each other in the first direction, and a plurality of first dummy patterns 140, which are formed in an island pattern in a first block B-1 between two adjacent ones of the printed circuit films 130.

Each of the printed circuit films 130 has a copper thin film layer (not illustrated) patterned therein, and the copper thin film layer is electrically connected to a pad electrode 120b in the unit panel areas 100. The printed circuit films 130a and 130b illustrated in FIG. 3 are merely for the purpose of indicating the positions at which the printed circuit films are to be located. In the actual mother substrate 10, the printed circuit films 130a and 130b are not directly attached thereto. After the unit panel areas 100 disposed on the mother substrate 10 are scribed and separated from each other, the printed circuit films 130a and 130b are bonded and attached to the substrate 101 of each unit panel areas 100. A plurality of printed circuit films 130 (130a and 130b) is provided, and the number of printed circuit films 130 is increased as the area of the display device is increased. The printed circuit films 130 are disposed so as to be spaced apart from each other at regular intervals in the lateral direction in order to prevent interference therebetween.

As illustrated in FIG. 2, gate lines GL (GL1, GL2, . . . ) and data lines DL (DL1, DL2, . . . ) are disposed so as to intersect each other in the active area AA. A subpixel SP is formed at the intersection between each gate line and each data line. Here, the location of the subpixel SP is defined as the location at which a signal is applied. In reality, however, the location of the subpixel SP, in which light transmission and light emission are realized, may not exactly correspond to the region between the gate line and the data line. That is, a component such as a bank or the like, which partitions a light-emitting part or a transmission part, may be additional defined, and the light-emitting part or the transmission part may be disposed so as to partially overlap the lines.

Although not illustrated in FIG. 2, the gate lines GL (GL1, GL2, . . . ) and the data lines DL (DL1, DL2, . . . ) are respectively disposed so as to be spaced apart from each other at regular intervals in the entire active area AA. As illustrated in FIG. 2, the gate lines GL (GL1, GL2, . . . ) and the data lines DL (DL1, DL2, . . . ) are disposed so as to intersect each other.

Gate drivers GIP1 and GIP2 are internally disposed in the non-active area of the substrate 101 so as to be connected to opposite ends of the gate lines GL (GL1, GL2, . . . ) in order to sequentially apply gate voltage signals to the gate lines GL (GL1, GL2, Here, the configuration in which the gate drivers are internally disposed in the substrate refers to the configuration in which the gate drivers are formed on the substrate 101 simultaneously with the process of forming the gate lines and the data lines. The gate drivers GIP1 and GIP2 include stages, which correspond to the respective gate lines, and shift registers and output buffer parts, which are provided in the respective stages and include a plurality of thin-film transistors.

In the description set forth below, the first direction represents a y-axis direction, which is the longitudinal direction of the data lines DL (DL1, DL2, . . . ), and the second direction, which intersects the first direction, is the longitudinal direction of the gate lines GL (GL1, GL2, . . . ).

A plurality of printed circuit films 130 is disposed in the pad portion PAD of the substrate 101, and supplies image signals to a plurality of data lines DL (DL1, DL2, . . . ), which have a blocked form.

Pad electrodes 120b are provided in the pad portion PAD of the substrate 101, which the printed circuit films 130 (130a and 130b) overlap, and are bonded to the copper thin film layers of the printed circuit films 130. The pad electrodes 120b are connected to the active area AA, which is disposed at the upper sides thereof, via link lines 120a, and are electrically connected at the lower sides thereof with first and second connection lines 120c and 120d.

The data lines DL (DL1, DL2, . . . ) are connected to the printed circuit films 130 (130a, 130b, . . . ), which are disposed in the pad portion PD, via the link lines 120a and the pad electrodes 120b. The first connection lines 120c are connected to the lower sides of the pad electrodes 120b and extend downwards, and the second connection lines 120d are connected to the first connection lines 120c and extend downwards so as to intersect the edge of the unit panel areas 100 and to overlap the shorting bar lines 110a, which are disposed outside the scribing line CL. Static electricity prevention elements ESD1, ESD2, ESD3 and ESD4 are provided at the points at which the second connection lines 120d and the shorting bar lines 110a intersect, and have a thin-film transistor or diode configuration. An inner region with respect to the scribing line CL is the first block B-1 and an outer region with respect to the scribing line CL is a second block B-2. The first connection lines 120c are positioned at the first block B-1 and the second connection lines 120d are at the second block B-2.

The link lines 120a, the pad electrodes 120b and the first and second connection lines 120c and 120d may transmit the same signal as each other and may be integrally formed in the same layer as each other. Alternatively, the above lines may be formed in different layers from each other (e.g. lines formed in a first layer and lines formed in a second layer), and may have connection parts at specific portions thereof so as to transmit the same signal as each other. In this case, the connection parts may have a larger width than the other parts of the lines. That is, the link lines 120a, the pad electrodes 120b and the first and second connection lines 120c and 120d illustrated in FIG. 3 indicate the signal connection relationship therebetween, and the widths thereof may vary.

The pad electrodes 120b may be formed in a larger area than the link lines 120a. Alternatively, the pad electrodes 120b may further include upper pad electrodes between the link lines 120a and the upper sides thereof.

The link lines 120a, the pad electrodes 120b, and the first and second connection lines 120c and 120d, which are disposed in the first direction, are formed of metal in the same layer as the gate lines GL and the data lines DL, and thus the provision of a separate mask may be omitted.

The printed circuit films 130a and 130b are disposed so as to be spaced a predetermined distance apart from each other in the horizontal (lateral) direction in order to avoid interference therebetween. The display device according to the present invention includes first dummy patterns 140 and the second dummy patterns 141, which are disposed near the scribing line CL corresponding to the edge of the unit panel and are formed of the same metal as the lines formed in the second layer, which corresponds to the layer formed above the metal layer forming the first and second connection lines 120c and 120d, thereby preventing leakage of light to the region in which the first and second connection lines 120c and 120d are formed during the exposure process. Thus, it is possible to prevent loss of the photosensitive film due to light leakage and to enable the normal formation of the first and second connection patterns 120c and 120d in the second direction.

The dummy patterns include first dummy patterns 140, which are disposed inside the scribing line CL, which is the edge of the unit panel areas 100, and which are left behind in the configuration of the final display device product, and second dummy patterns 141, which are disposed between the shorting bar lines 110a, which are disposed outside the scribing line CL of the display panel 100, and which are removed after the scribing process. That is, the second dummy patterns 141 which are disposed at the second block B-2 from the scribing line SL to an edge (MG) of the mother substrate, may be removed after the scribing process.

Actually, the first dummy patterns 140 and the second dummy patterns 141 are formed in the mother substrate 10, and are capable of preventing adverse effects attributable to light leakage, which may occur at the exposure boundary region.

The first and second connection lines 120c and 120d, which are connected to the pad electrodes 120b, which the printed circuit films 130a and 130b overlap, are electrically connected to the lines disposed in the first direction (y-axis direction), i.e. are electrically connected to the data lines DL. The printed circuit films 130a and 130b supply image signals, which correspond to blue (B), green (G), red (R) and white (W) color signals, to the data lines DL via the pad electrodes 120b connected thereto. On the substrate 101, the pad electrodes 120b are electrically connected to the data lines DL located thereabove via the link lines 120a connected to the upper sides thereof, and are electrically connected to the static electricity prevention elements ESD1 to ESD4 located thereunder via the first connection lines 120c and the second connection lines 120d connected to the lower sides thereof. Thus, the image signals supplied via the printed circuit films 130a and 130b (refer to FIG. 3) are also supplied to the first connection lines 120c and the second connection lines 120d in the first direction.

As described above, the first and second connection lines 120c and 120d, which are disposed in the first direction, may be formed in a single-layer structure in the longitudinal direction thereof, or may be formed in a double-layer structure in the longitudinal direction thereof so as to have connection parts at specific portions thereof.

The display device according to the present invention is configured such that the unit panel areas 100 is included in the backplane substrate, such that light-shielding metal LS is disposed in most of the region of the active area AA, in which the lines are disposed, in the direction substantially perpendicular to the substrate 101, and such that insulation layers are provided on the light-shielding metal LS and the metal formed on another layer and between the metals in the region in which the lines requiring electrical insulation from each other intersect each other.

The display device according to the present invention may be used as an organic light-emitting display device or a quantum dot display device by providing a light-emitting diode in each subpixel SP within the active area AA, may be used as a liquid crystal display device by providing a liquid crystal layer at a position facing the substrate 101 and providing a backlight unit below the substrate 101, or may be used as an electrophoretic display device by providing an electrophoretic layer between the substrate 101 and an opposite substrate (not illustrated).

Figure 9A:
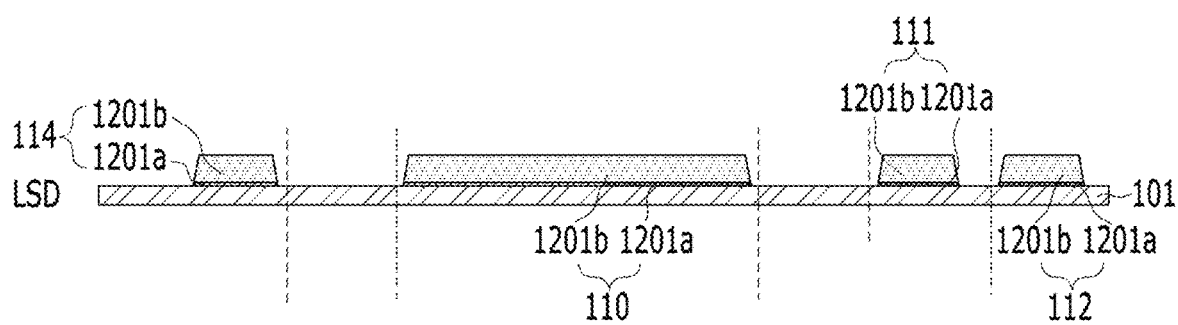
FIGS. 9A to 9I are process sectional views illustrating a method of manufacturing a display device according to the present disclosure.

Here, the light-shielding metal LS may be formed, for example, so as to have a molybdenum/copper (Mo/Cu) double-layer structure 114 (refer to 1201a and 1201b in FIG. 9A). When copper (Cu) is processed to have a certain thickness, e.g. 6000 Å, and is used for a line, it is possible to lower the resistance in the longitudinal direction of the line. In particular, the application of the metal alloy and the thickness described above makes it possible to reduce a resistance load in a large-area display device having an increased dimension in the longitudinal direction thereof due to the increase in the area of the substrate 101.

However, when the Mo/Cu light-shielding metal LS is used for the first-layer lines 1201, the first-layer lines 1201 have a thickness of 6000 Å, preferably 8000 Å or greater, in order to sufficiently lower the resistance. Thus, the layers to be disposed above the first-layer lines 1201 are formed along the large stepped portion between the region in which the first-layer lines 1201 are formed and the region in which the first-layer lines 1201 are not formed.

A buffer layer 151 and an interlayer insulation film 154 are formed on the substrate 101, on which the first-layer lines 1201 have been formed, and second-layer lines 1401 are disposed on the interlayer insulation film 154 and form the first and second connection lines 120c and 120d, which are not defined by the first-layer lines 1201.

FIG. 4 illustrates the configuration in which the first and second connection lines 120c and 120d are formed by the second-layer lines 1401 so as to be connected to the data lines that receive, for example, blue B and white W color signals.

The first connection lines 120c are formed by the first-layer lines 120 so as to be connected to the data lines DL that receive green G and red R color signals, and the second connection lines 120d are formed by overlapping the first-layer lines 1201 and the first connection patterns 1401p and forming first connection parts CT1 at the points at which the first-layer lines 1201 and the first connection patterns 1401p overlap.

Figure 9B:
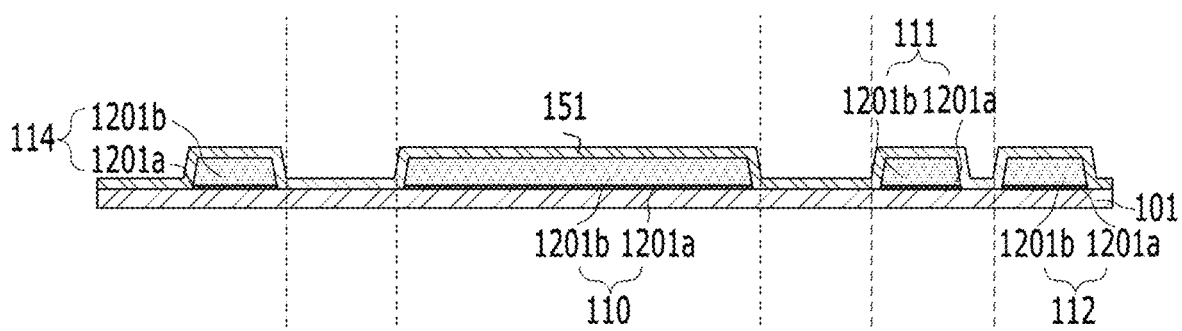
Figure 9C:
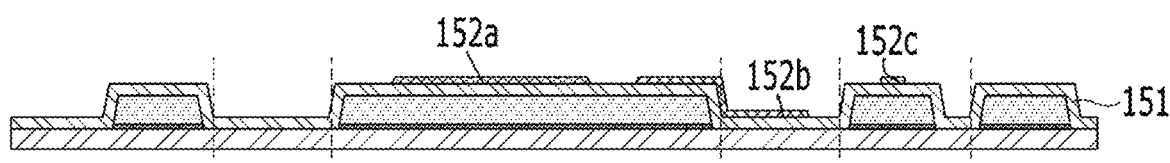
Figure 9D:
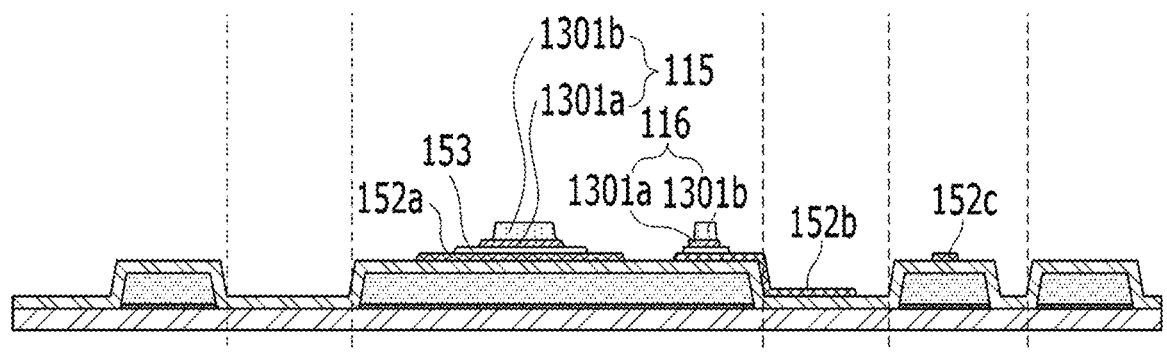
Figure 9E:
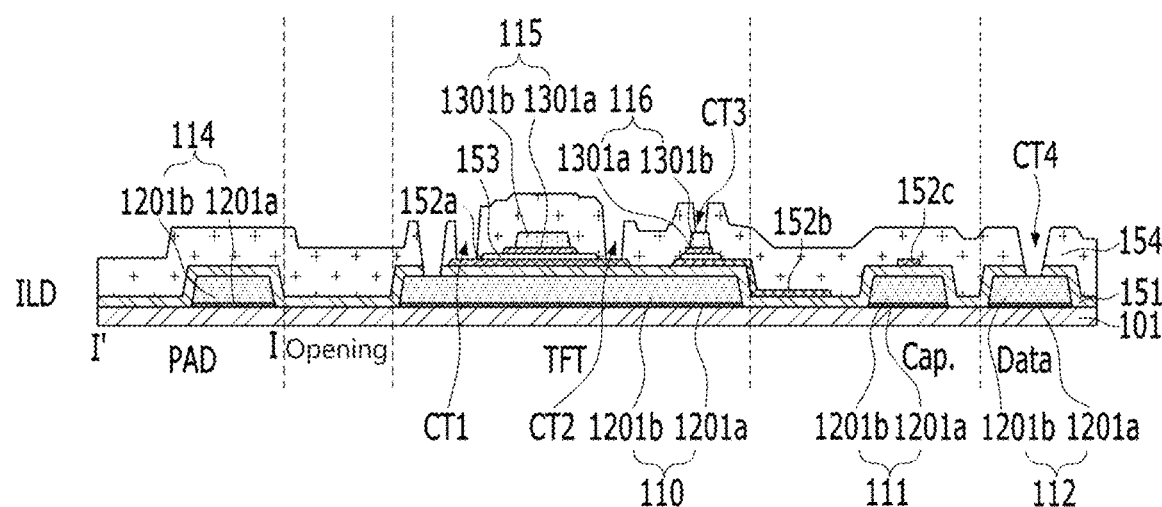
Figure 9F:
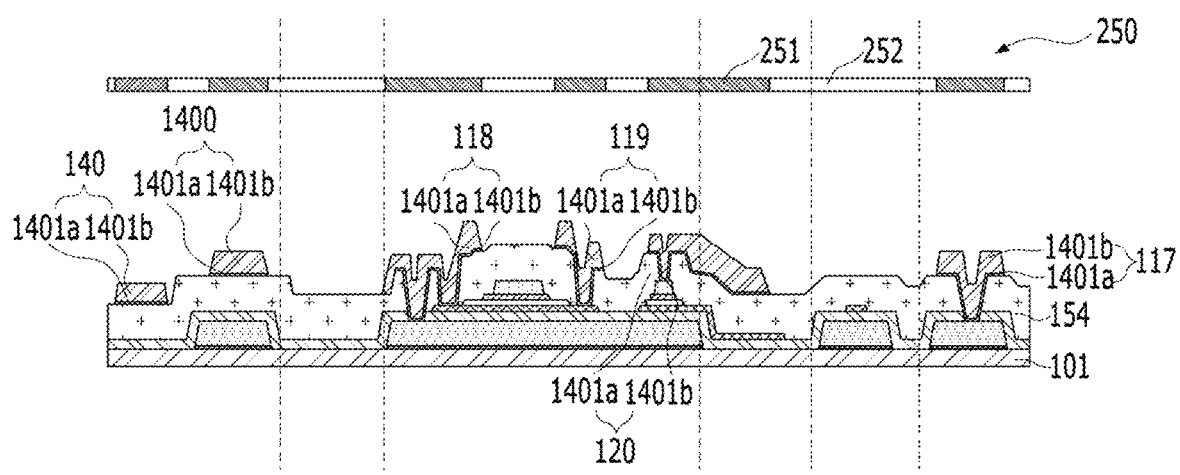

The second-layer lines 1401 may be formed of the same metal material as the first-layer lines 1201, i.e. may be formed to have a Mo/Cu double-layer structure (refer to 1401a and 1401b in FIG. 9F).

Here, like the second connection lines 120d connected to the green and red data lines DL, the first connection patterns 1401p have second connection parts CT2, disposed below the first connection parts CT1, for connection with first electrode dummy patterns 162a, which are formed in the same layer as a first electrode 162 (refer to FIG. 9h) of the organic light-emitting diode, and the first electrode dummy patterns 162a may extend downwards and may intersect the shorting bar lines 110a.

Alternatively, in the configuration for use as a power source voltage line VDDL, the second connection lines 120d may have first connection parts CT1 between the first-layer lines 1201 and the first connection patterns 1401p, which are formed in the same layer as the second-layer lines 1301, and only the single-layered second-layer lines 1301 may extend downwards from the first connection parts CT1, and may intersect the shorting bar lines 110a.

In addition, for example, when first overlapping patterns 1400, which are formed in the same layer as the second-layer lines 1401, are disposed so as to overlap the first-layer lines 1201, such as the power source voltage line VDDL, the first dummy patterns 140 may prevent adverse effects attributable to leakage of light to the side portion of the exposure boundary region and consequently may prevent loss of the first overlapping patterns 1400 in the exposure boundary region (the region near the scribing line), which is influenced by multiple exposure shots.

In addition, the second dummy patterns 141 are formed in the same layer as the second-layer lines 1401 in the region that is horizontally adjacent to the first connection parts CT1 of the first connection patterns 1401p, which are connected in an overlapping manner with the first-layer lines 1201 disposed in the longitudinal direction of the power source voltage line VDDL, thereby preventing loss of the patterns due to light leakage, like the first dummy patterns 140.

Here, the first connection patterns 1401p, which are disposed outside the scribing line CL, are connected to the static electricity prevention elements ESD1, ESD2, ESD3 and ESD4 via the shorting bar lines 110a, which are located thereunder. Thus, the connection between the first connection patterns 1401p and the static electricity prevention elements ESD1, ESD2, ESD3 and ESD4 needs to be maintained during the processing before the scribing process is performed. Therefore, in the display device according to the present invention, the second dummy patterns 141 are disposed not only inside the scribing line CL but also outside the scribing line CL, and thus the first connection patterns 1401p are stabilized in shape and are connected to the static electricity prevention elements ESD1, ESD2, ESD3 and ESD4 without disconnection therefrom during processing, thereby stabilizing the corresponding lines and consequently preventing damage to the lines during the processing.

Although it is illustrated in the plan view of FIG. 4 by way of example that the scribing line CL is located above the first connection parts CT1, the area of the pad portion PAD may be increased so that the scribing line CL is located below the first connection parts CT1 as needed. In this case, both the first overlapping patterns 1400 and the first connection patterns 1401p are disposed inside the pad portion PAD, and the first and second dummy patterns 140 and 141 are horizontally disposed near the first overlapping patterns 1400 and the first connection patterns 1401p, respectively. The areas of the first and second dummy patterns 140 and 141 may be set to values capable of preventing damage to the first overlapping patterns 1400 and the first connection patterns 1401p due to light leakage, but the areas thereof may be varied as needed.

It is desirable that the first dummy patterns 140 have a larger area then the first overlapping patterns 1400. The first overlapping patterns 1400 and the first-layer lines 1201 are disposed in different layers from each other so as to merely overlap each other when viewed in plan, but are not electrically connected to each other. The first dummy patterns 140 need to have a certain area or greater in order to prevent damage due to light leakage.

The first and second dummy patterns 140 and 141 are formed to have a rectangular shape when viewed in plan, without being limited thereto. The first and second dummy patterns 140 and 141 may be formed in any of various other planar shapes, such as a polygonal, circular or elliptical shape, so long as they are capable of preventing light leakage at the exposure boundary region. In order to effectively control light leakage, the first and second dummy patterns 140 and 141 may be spaced apart by a distance of 2 μm or greater from the first overlapping patterns 1400 and the first connection patterns 1401p, which are disposed in the same layer as the first and second dummy patterns 140 and 141.

The first and second dummy patterns 140 and 141 are located at a height lower than the first overlapping patterns 1400. This is because no lines are disposed under the first dummy patterns 140 or the second dummy patterns 141.

The first and second dummy patterns 140 and 141, which are formed in an island shape, are disposed in the same layer as the second-layer lines 1401, but are electrically separated from the second-layer lines 1401. This is because the first and second dummy patterns 140 and 141 are not used to electrically connect the elements to each other, but are used only to prevent light leakage. Moreover, although the first and second dummy patterns 140 and 141 are partially removed after the scribing process, the function of the display device is not affected thereby.

As illustrated in FIG. 3, the first dummy patterns 140 may not overlap the printed circuit films 130a and 130b, but may be disposed closer to the edge of the substrate 101 than the printed circuit films 130a and 130b, or may be disposed so as to be in contact with the edge of the substrate 101.

Hereinafter, a method of manufacturing the display device according to the present invention for preventing damage due to light leakage and ensuring the reliability of the configuration of the pad portions will be described with reference to FIGS. 1 to 5.

According to the method of manufacturing the display device of the present invention, as illustrated in FIG. 1, unit panels 100, which are spaced apart from each other and each of which has an active area AA, a non-active area formed around the active area AA, and a pad portion PAD defined at one side of the non-active area, are defined on a mother substrate 10.

Subsequently, as illustrated in FIG. 3, first-layer lines 1201 (refer to 114 in FIG. 9A) are formed in the pad portion PAD in a first direction, which intersects the edge of the unit panel 100.

Second-layer lines 1401 are formed in the first direction, which intersects the edge of the unit panel 100, so as to be spaced apart from the first-layer lines 1201. First connection patterns 1401p are formed in the same layer as the second-layer lines 1401 so as to partially overlap the first-layer lines 1201. A plurality of first dummy patterns 140 is formed near the edge of the unit panel 100 so as not to overlap either the first-layer lines 1201 or the second-layer lines 1401.

In addition, during the formation of the first connection patterns 1401p, first overlapping patterns 1400 may be further formed in the same layer as the second-layer lines 1401 in the pad portion PAD so as to partially overlap the first-layer lines 1201.

In addition, the first connection patterns 1401p may be disposed adjacent to the pad portion PAD in the external area of the unit panel areas 100.

In addition, the manufacturing method may further include a step of forming a plurality of gate lines GL in a second direction, which intersects the first direction, in the active area AA of the unit panel areas 100, as illustrated in FIG. 9D to be described later, between the step of forming the first-layer lines 1201 and the step of forming the second-layer lines 1401.

In the step of forming the first-layer lines 1201 or the step of forming the second-layer lines 1401, a plurality of data lines DL may be formed in the active area AA in the first direction.

In the step of forming the first-layer lines 1201, shorting bar lines 110a are formed in the region between the unit panel areas 100 so as to be adjacent to the pad portion PAD.

The first-layer lines 1201 and the second-layer lines 1401 may be connected at one sides thereof to the data lines DL via pad electrodes 120b and link lines 120a in the mother substrate 10, and may be connected at the opposite sides thereof to the shorting bar lines 110a across the edge of the unit panel areas 100 in the mother substrate 10.

In addition, in the step of forming the second-layer lines 1401, second dummy patterns 141 may be formed outside the pad portion PAD so as to overlap the shorting bar lines 110a.

The step of forming the second-layer lines 1401 and the first and second dummy patterns 140 and 141 may include a step of depositing a second-layer-line-forming material and coating a photosensitive film thereon, a step of sequentially performing an exposure process on the photosensitive film for the respective unit panel areas using a mask, a step of forming a photosensitive film pattern by developing the photosensitive film, and a step of forming the second-layer lines, the first connection patterns, the first dummy patterns 140 and the second dummy patterns 141 by removing the second-layer-line-forming material that is exposed through the photosensitive film pattern. A detailed description of this process will be made with reference to FIG. 9F. According to the method of manufacturing the display device of the present invention, in order to prevent the first overlapping patterns 1400 and the first connection patterns 1401p, which overlap the first-layer lines 1201 having a large thickness, from being lost at the exposure boundary region due to interference of subsequent exposure light, the first and second dummy patterns 140 and 141 are formed in the region in which no signal lines are formed near the first overlapping patterns 1400 or the first connection patterns 1401p.

After the substrates 101, each including the first-layer lines 1201 and the second-layer lines 1401, are completely arranged on the mother substrate 10, the mother substrate 10 is scribed in order to define the respective unit panel areas 100.

Subsequently, a plurality of printed circuit films 130 (130a and 130b), each of which has a drive IC, is bonded to the pad portion PAD of each of the unit panel areas 100 so as to overlap the pad electrodes 120*b* and to be spaced a first distance d apart from the edge of each of the unit panel areas 100 in the first direction. The printed circuit films 130 (130*a* and 130*b*) are spaced apart from each other at regular intervals in a second direction, which intersects the first direction.

Hereinafter, problems with a comparative example, which has no dummy patterns, unlike the display device according to the present invention, will be described.

Figure 6B:
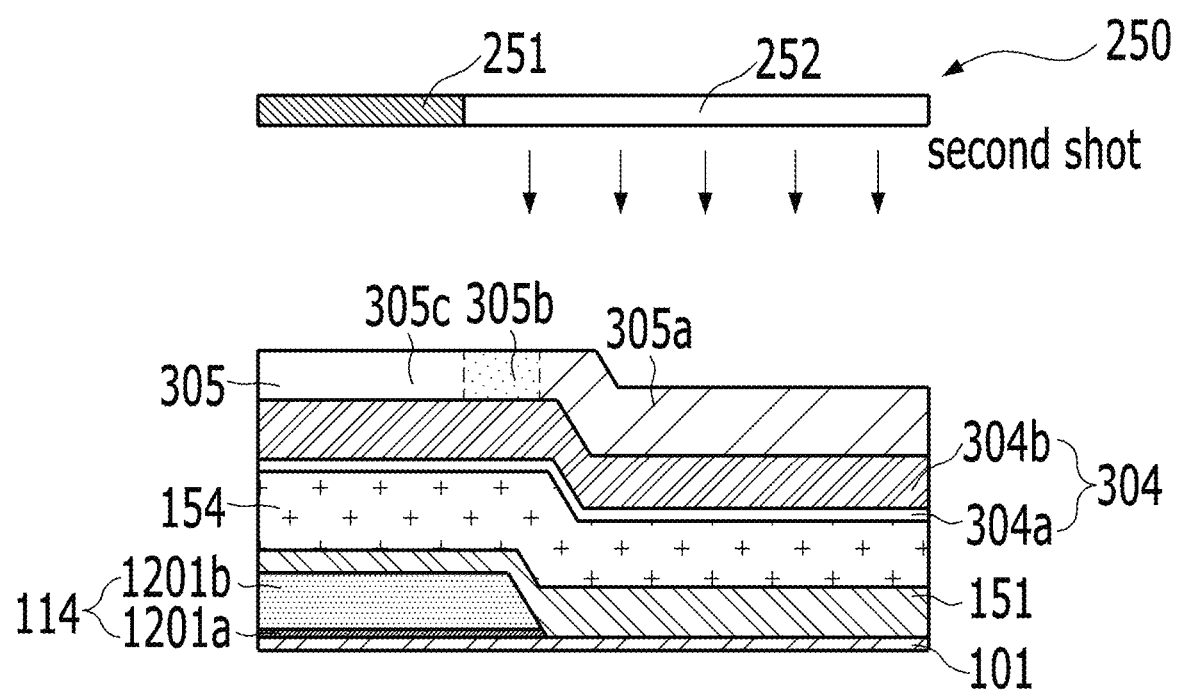
Figure 7:
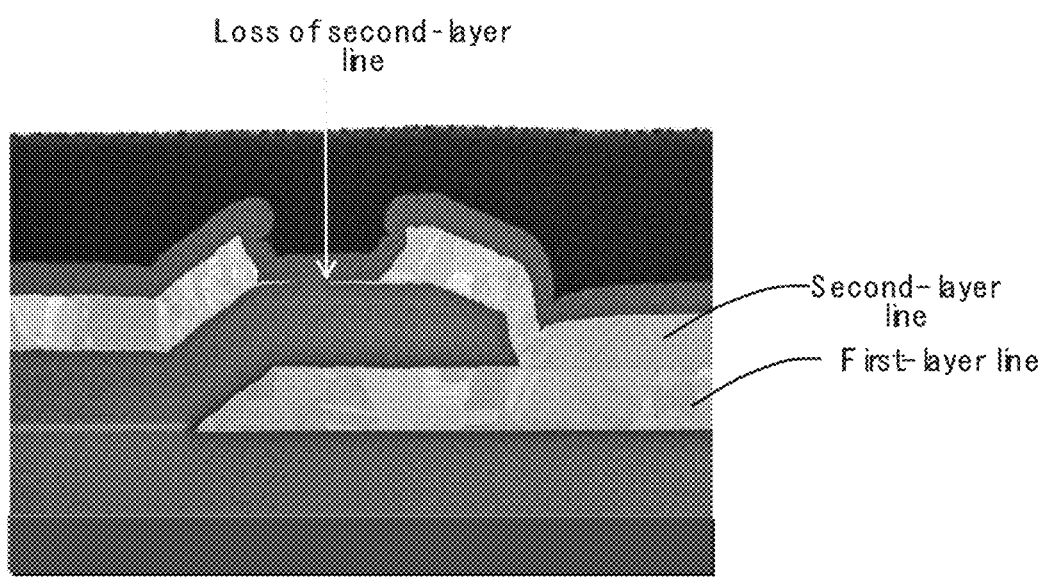
FIG. 7 is an SEM view showing defective connection between first-layer lines and second-layer lines in the display device according to the comparative example.

FIGS. 6A and 6B are cross-sectional views illustrating a process of exposing second-layer lines when a display device according to the comparative example is manufactured, and FIG. 7 is an SEM view showing defective connection between first-layer lines and second-layer lines in the display device according to the comparative example.

FIGS. 6A and 6B illustrate the exposure process for patterning the second-layer lines. Specifically, FIG. 6A illustrates the use of a mask 250 during a first exposure shot, and FIG. 6B illustrates the use of a mask 250 during a second exposure shot.

As illustrated in FIG. 6A, a buffer layer 151 and an interlayer insulation film 154 are formed on the substrate 101, on which the first-layer lines 114 (1201*a* and 1201*b*) have been formed, and subsequently second-layer lines 304, which include metal alloys 304*a* and 304*b*, are formed.

Subsequently, a photosensitive film 305 is formed on the second-layer lines 304. The photosensitive film 305 is a positive photosensitive film, which is formed in a manner such that a portion thereof that is exposed to light is degraded and is then removed in a developing process and a portion 305*c* thereof that was not degraded is left behind. In the case in which the photosensitive film 305 is a negative photosensitive film, the positions of an opening and a light-shielding portion of a mask for use in the negative photosensitive film may be reversed from the positions of an opening and a light-shielding portion of a mask for use in the positive photosensitive film.

Although the first-layer lines 114, which are located at a relatively low position, are formed with a large height, there is only a small difference in height between the top surface of the portion of the photosensitive film 305 under which the first-layer lines 114 are formed and the top surface of the portion of the photosensitive film 305 under which the first-layer lines 114 are not formed, because the photosensitive film 305 has planarization characteristics. That is, the portion of the photosensitive film 305 under which the first-layer lines 114, having a relatively large height, are formed has a relatively small thickness, and the portion of the photosensitive film 305 under which the first-layer lines 114 are not formed has a relatively large thickness.

A mask 250, which has a light-shielding portion 251 and an opening 252, is disposed above the photosensitive film 304.

As illustrated in FIG. 6A, when a first exposure shot is applied to the photosensitive film 305 through the opening 252, a first portion 305*a* of the photosensitive film 305, which corresponds to the opening 252, is degraded.

Subsequently, as illustrated in FIG. 6B, the position of the mask is shifted so that a second exposure shot is applied to another unit panel areas 100.

Here, even when the same mask 250 is used, a boundary region 305*b* that was shielded during a previous exposure shot may be exposed during a subsequent exposure shot, and thus may be degraded.

In particular, if the first-layer lines 114, disposed at a low position, have a large thickness, the thickness of the portion of the photosensitive film 305 that is located above the first-layer lines 114 is small, and thus the exposure boundary region 305*b* may be easily degraded even by a weak lateral light beam during the second exposure shot.

Subsequently, a developing process is performed on the photosensitive film, which has the first portion 305*a*, the degraded exposure boundary region 305*b* and the non-degraded portion 305*c*, as illustrated in FIG. 6B, with the result that only the non-degraded portion 305*c* is left behind. Subsequently, an etching process is performed using the photosensitive film patterned in this manner as a mask, whereby the second-layer lines 304 are patterned with a width corresponding to the non-degraded portion 305*c*, which may result in loss of the pattern corresponding to the width of the degraded exposure boundary region 305*b* compared to the width of the pattern intended to be obtained using the mask 250 illustrated in FIG. 6A.

Moreover, in the comparative example, a short-circuit may occur in a large stepped portion due to pattern loss and interference during the exposure process.

FIG. 7 shows partial loss of the second-layer lines at the first connection parts during the process of manufacturing the display device according to the comparative example (having no dummy patterns). In the comparative example, normal transmission of signals in the first direction to the first and second connection lines via the link lines and the pad electrodes is not realized, and thus the static electricity prevention element does not operate, which may cause undesired generation of static electricity during processing.

Figure 8:
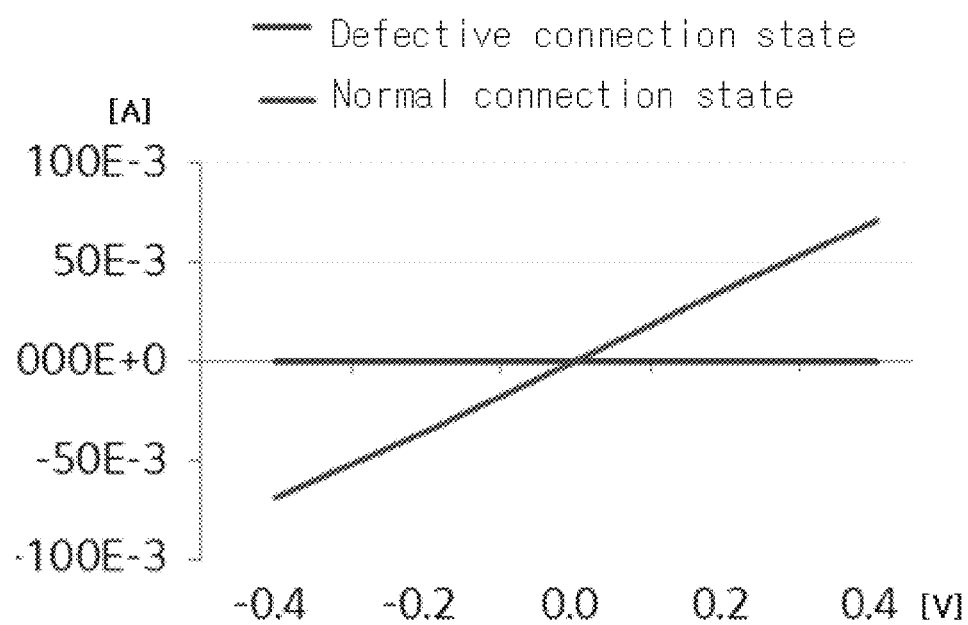
FIG. 8 is a graph showing resistance between N1 and N2, illustrated in FIG. 4, measured in a normal connection state and a defective connection state.

FIG. 8 is a graph showing the resistance between first node N1 and second node N2 in the normal connection state and the defective connection state.

As illustrated in FIG. 8, when the voltage between a first node N1 and a second node N2 of the mother substrate 10, which is used in the method of manufacturing the display device having the first and second dummy patterns according to the present invention, was changed, the current increased linearly, and the resistance between the first node N1 and the second node N2 had a value of about 4Ω. However, in the comparative example, which has no dummy patterns, a short-circuit occurred, and thus the measurement of resistance was impossible.

Based on the results of the above experimentation, it was proved that, according to the display device and the manufacturing method thereof according to the present invention, the lines formed above a stepped portion were not influenced by light leakage, and a short-circuit of the patterns was prevented.

Hereinafter, the method of manufacturing the display device according to the present invention will be described with reference to FIGS. 9A to 9I. An organic light-emitting display device is illustrated by way of example in FIGS. 9A to 9I, but the present invention is not limited thereto. The present invention is applicable to any of various other display devices, including those from which a light-emitting unit may be eliminated.

FIGS. 9A to 9I are process sectional views illustrating the method of manufacturing the display device according to the present disclosure.

In the method of manufacturing the display device according to the present invention illustrated in FIGS. 9A to 9I, the substrate 101 is largely divided into a pad portion PAD, an opening through which light is emitted, a thin-film transistor area, a storage capacitor area Cap, and a data line area.

As illustrated in FIG. 9A, a first metal layer, which has a double-layer structure including a Mo metal layer 1201*a* and a Cu metal layer 1201b, is deposited on the substrate 101 and is selectively removed, with the result that a pad electrode of the first-layer line 114 is formed in the pad portion PAD, a light-shielding layer 110 is formed in the thin-film transistor area, a first storage electrode 111 is formed in the storage capacitor area Cap, and a lower data electrode 112 is formed in the data line area. The Cu metal layer 1201b may be substituted by aluminum (Al), chrome (Cr), gold (Au), nickel (Ni), or neodymium (Nd) as needed. In the display device according to the present invention, the alloy layer, which includes the Mo metal layer 1201a and the Cu metal layer 1201b, is applied to most of the area in which the lines and the active layer are formed. Because the lines are formed to be long in a longitudinal direction along the long side and the short side of the substrate 101, the alloy layer is required to have low resistance in order to reduce line delay in the lines, which are formed to be long. In particular, in a large-area display device having a size of 60 inches or greater, the alloy layer is required to have a thickness of 6000 Å or greater in order to exhibit low resistance to thus prevent a brightness difference between the areas. In this regard, it is desirable that the alloy layer including Cu metal, which has excellent low resistance characteristics and line processability, be used as the first metal layer forming the light-shielding layer 110.

In addition, shorting bar lines may also be formed as the first metal layer outside the unit panel areas 100 on the mother substrate 10.

Subsequently, as illustrated in FIG. 9B, a buffer layer 151 is deposited on the entire surface of the substrate 101.

Subsequently, as illustrated in FIG. 9C, a semiconductor material layer, such as an oxide semiconductor, a polysilicon, or an amorphous silicon, which includes at least one metal selected from the group consisting of Zn, Cd, Ga, In, Sn, Hf, and Zr, is deposited on the light-shielding layer 110, and is then selectively removed, with the result that a first active layer 152a and 152b and a second active layer 152c are formed on a predetermined portion above the light-shielding layer 110 and on a predetermined portion above the first storage electrode 111, respectively.

Subsequently, as illustrated in FIG. 9D, a gate insulation film 153 is formed on the buffer layer 151, on which the first active layer 152a and 152b and the second active layer 152c have been formed. Subsequently, a second metal layer having a double-layer structure 1301a and 1301b, which includes Al, Ag, Cu, Pb, Mo, Ti, or an alloy thereof, is formed, and is then selectively removed, with the result that the gate insulation film 153, a gate electrode 115 and a first connection storage electrode 116 are left behind above a predetermined portion of the first active layer 152a and 152b. Although a configuration in which only one driving thin-film transistor is provided in each subpixel has been described by way of example, a switching thin-film transistor may be further provided in the same process so as to be connected to the driving thin-film transistor.

The gate insulation film 153, the gate electrode 115 and the first connection storage electrode 116 may be formed so as to have different widths from each other by applying respectively different etching rates using the same mask. Because the gate insulation film 153 protects the channel region of the first active layer 152a and 152b, it is desirable that the gate insulation film 153 be formed so as to have a larger width than the gate electrode 115 and the first connection storage electrode 116. The portions of the first active layer 152a and 152b and the second active layer 152c that are exposed from the gate electrode 115 and the first connection storage electrode 116 are conductive regions.

In addition, gate lines GL (refer to FIG. 2) may be formed in the same layer as the gate electrode 115 in the same process so as to be connected to the gate electrode 115.

Subsequently, as illustrated in FIG. 9E, an interlayer insulation film 154 is deposited on the entire surface of the substrate, and is then selectively removed, with the result that connection holes are formed so as to expose portions of the upper sides of the first active layer 152a and 152b, the first connection storage electrode 116 and the lower data electrode 112.

Subsequently, as illustrated in FIG. 9F, a third metal layer having a double-layer structure 1401a and 1401b, which includes metal having a conductivity that is the same as or similar to that of the first metal layer, is deposited on the entire surface of the interlayer insulation film 154, and a photosensitive film (not illustrated) is coated thereon. Subsequently, a mask 550, which has an opening 252 and a light-shielding portion 551, is provided, and a photosensitive film pattern (not illustrated) is formed by removing a portion of the photosensitive film that is exposed to light through the opening 552. Subsequently, a portion of the third metal layer 1401a and 1401b, which corresponds to the exposed portion of the photosensitive film pattern, is removed, with the result that a first overlapping pattern 1400 is formed in the pad portion so as to overlap the first dummy pattern 140 and the first-layer line 114, a source electrode 118 and a drain electrode 119 are formed so as to be connected to opposite ends of the first active layer 152a through the connection holes, a second storage electrode 120 is formed so as to be connected to the first connection storage electrode 116, and an upper data electrode 117 is formed so as to be connected to the lower data electrode 112 while overlapping the same.

Subsequently, the photosensitive film pattern is stripped and removed.

Here, in addition to the first dummy pattern 140, a second dummy pattern 141 is also formed outside the scribing line CL, which was described above with reference to FIGS. 2 to 5, thereby preventing loss of the line patterns due to light leakage at the inside and outside of the scribing line CL.

The first dummy pattern 140 and the second dummy pattern 141 are formed so as to overlap the first-layer line 114, which is disposed thereunder and is formed in the same layer as the light-shielding layer 110, and form a second metal layer at the region in which the first and second dummy patterns are formed. Thus, the first dummy pattern 140 and the second dummy pattern 141 are referred to as a second-layer line.

A data line DL and a power source voltage line VDDL may be formed during the above-described process of patterning the third metal layer (the second-layer line), or may be formed during the above-described process of patterning the first metal layer 1201a and 1201b.

Figure 9G:
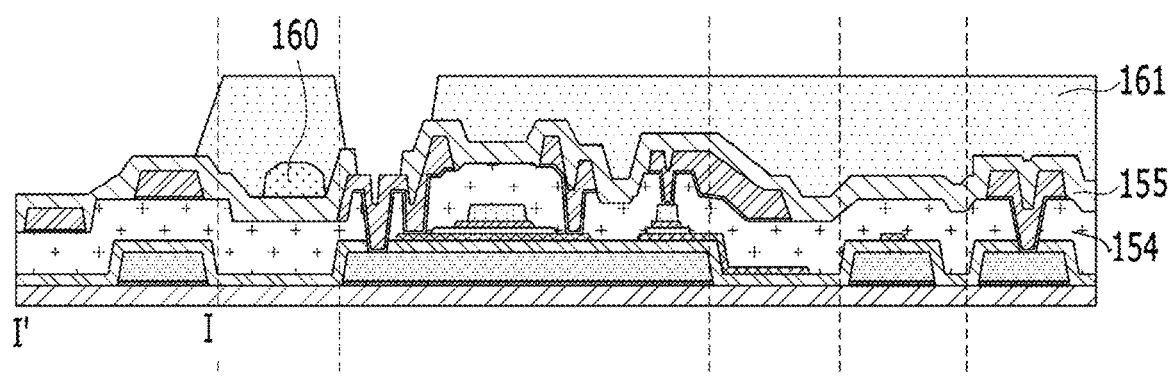

Subsequently, as illustrated in FIG. 9G, a front protective film 155 is formed, and a color filter layer 160 is formed so as to correspond to the opening.

Subsequently, an overcoat layer 161 is formed in a shape that exposes a portion of the source electrode 118 and the pad portion PAD.

Figure 9H:
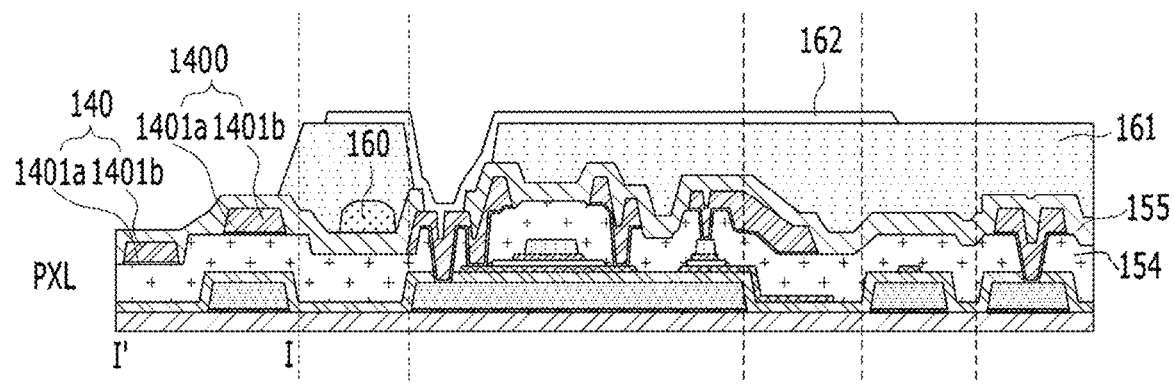

Subsequently, as illustrated in FIG. 9H, a transparent metal layer is deposited, and is then selectively removed, with the result that a first electrode 162 is formed over the thin-film transistor area TFT, the opening and the storage capacitor area Cap so as to be connected to the source electrode 118. The first electrode 162 may also be called as a 'pixel electrode' PXL.

Figure 9I:
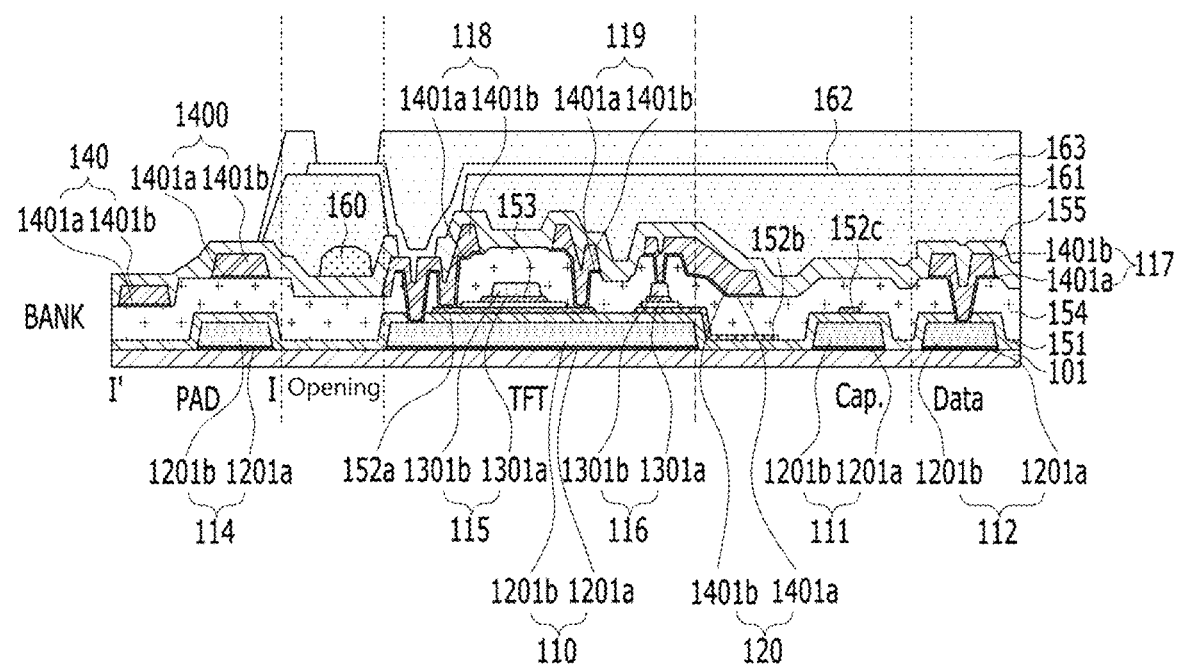

Subsequently, as illustrated in FIG. 9I, a bank 163 is formed so as to cover the regions, other than the opening and the pad portion PAD, thereby defining the light-emitting area.

Subsequently, although not illustrated, if an organic light-emitting display device is used as the display device according to the present invention, an organic stack (not illustrated), including an emission layer, and a second electrode (not illustrated) are deposited on the construction illustrated in FIG. 9I. An assembly including the first electrode 162, the organic stack, and the second electrode is referred to as an organic light-emitting diode. The organic light-emitting diode is connected to the driving thin-film transistor of each subpixel in order to enable light emission of the corresponding subpixel. The organic stack may include a hole-related layer and an electron-related layer, with the emission layer interposed therebetween. The hole-related layer may include a hole injection layer, a hole transport layer, and an electron-blocking layer. The electron-related layer may include a hole-blocking layer, an electron transport layer, and an electron injection layer.

After the unit panel areas 100 are completely arranged on the mother substrate 10, the unit panel areas 100 are separated from each other through the scribing process, as described above. Subsequently, a process of bonding a printed circuit film (chip-on-film (COF)) to the pad electrode 120b (refer to FIG. 3) of the pad portion PAD of each unit panel areas 100 is performed.

According to the display device of the present invention manufactured as described above, even when the first-layer lines are formed to have a large thickness in order to ensure low resistance of lines, since the dummy patterns are formed adjacent to a double-line structure, in which upper lines overlap lower lines, near the copper thin film (printed circuit film) having a double-line-connection structure, the amount of exposure light that is transmitted to the side portion of the double-line-connection structure, which has a large stepped portion, is reduced by the dummy patterns, thereby preventing loss of patterns, which occurs at a large stepped portion of the double-line structure or at an exposure boundary region due to light leakage.

In addition, in the display device according to the present invention constructed as described above, since signal lines are stably formed near the copper thin film, all of the signal lines are stably formed without a short-circuit or exposure. Thereby, it is possible to prevent line defects due to loss of lines and patterns in the edge area.

As is apparent from the above description, a display device and a method of manufacturing the same according to the present invention have the following effects.

First, a mother substrate, on which a plurality of panel areas is provided, is subjected to an exposure process in a manner such that the respective panel areas are sequentially scanned. Thus, the boundary region between the panel areas may be a boundary region between the previous exposure process and the subsequent exposure process. According to the display device of the present invention, a plurality of dummy patterns is formed in a region that is harmed by interference of subsequently radiated exposure light, thereby preventing signal lines from being lost by light leakage during a second exposure process.

Second, even when the first-layer lines are formed to have a large thickness in order to ensure low resistance of lines, since the dummy patterns are formed adjacent to a double-line structure, in which upper lines overlap lower lines, near the copper thin film (printed circuit film) having a double-line-connection structure, the amount of exposure light transmitted to the side portion of the double-line-connection structure, which has a large stepped portion, is reduced by the dummy patterns, thereby preventing loss of patterns, which occurs at a large stepped portion of the double-line structure or at an exposure boundary region due to light leakage.

Third, in the display device according to the present invention constructed as described above, since signal lines are stably formed near the copper thin film, all of the signal lines are stably formed without a short-circuit or exposure. Thereby, it is possible to prevent line defects due to loss of lines and patterns in the edge area.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. A display device, comprising:
   a substrate having an active area, a non-active area around the active area, and a pad portion at one side of the non-active area;
   a plurality of printed circuit films in the pad portion, each of the printed circuit films having a drive Integrated circuit (IC), the printed circuit films being spaced a first distance apart from an edge of the substrate in a first direction and being spaced apart from each other at regular intervals in a second direction that intersects the first direction;
   a first-layer line and a second-layer line within the first distance between the printed circuit films and the edge of the substrate so that the first-layer line and the second-layer line are respectively adjacent to the printed circuit films each in the first direction; and
   a plurality of dummy patterns on a same layer as the second-layer line in a region between two adjacent ones of the printed circuit films, the plurality of dummy patterns having island shapes, respectively.

2. The display device according to claim 1, wherein the dummy patterns are disposed closer to the edge of the substrate than the printed circuit films or are in contact with the edge of the substrate without overlapping the printed circuit films.

3. The display device according to claim 1, further comprising:
   a first overlapping pattern disposed on a same layer as the second-layer line, the first overlapping pattern partially overlapping the first-layer line.

4. The display device according to claim 1, further comprising:
   a first connection pattern disposed on a same layer as the second-layer line, the first connection pattern partially overlapping and being connected to the first-layer line.

5. The display device according to claim 1, further comprising:
   an insulation film disposed between the first-layer line and the second-layer line.

6. The display device according to claim 5, wherein the first-layer line is disposed under the insulation film, and
   wherein the plurality of dummy patterns are disposed on the insulation film.

7. The display device according to claim 1, wherein the first-layer line comprises copper (Cu) and has a thickness of 6000 Å or greater.

8. The display device according to claim 1, further comprising:
a plurality of gate lines and a plurality of data lines disposed in the active area intersecting each other,
wherein the first-layer line and the second-layer line are electrically connected to the plurality of data lines.

9. The display device according to claim 3, wherein the dummy patterns are disposed at a lower position so as to be closer to the substrate than the first overlapping pattern.

10. The display device according to claim 1, wherein the dummy patterns have a larger area than the first overlapping pattern.

11. A method of manufacturing a display device, the method comprising:
defining unit panel areas on a mother substrate so as to be spaced apart from each other, each of the unit panel areas having an active area, a non-active area around the active area, and a pad portion at one side of the non-active area;
forming a first-layer line in the pad portion in a first direction, the first-layer line intersects an edge of each of the unit panel areas;
forming a second-layer line in the first direction, so as to be spaced apart from the first-layer line at each of the unit panel areas, forming a first connection pattern to partially overlap the first-layer line, and forming a plurality of first dummy patterns near the edge of each of the unit panel areas so as not to overlap either the first-layer line and the second-layer line.

12. The method according to claim 11, further comprising:
forming a first overlapping pattern disposed on a same layer as the second-layer line to partially overlap the first-layer line.

13. The method according to claim 11, wherein the first connection pattern is disposed adjacent to the pad portion in an external area of each of the unit panel areas.

14. The method according to claim 11, after forming the first-layer line and before forming the second-layer line; further comprising:
forming a plurality of gate lines in a second direction, the second direction intersects the first direction, in the active area of each of the unit panel areas.

15. The method according to claim 11, when forming the first-layer line, further comprising:
forming a plurality of data lines in the active area in the first direction, or when forming the second-layer line, further comprising:
forming a plurality of data lines in the active area in the first direction.

16. The method according to claim 15, further comprising:
when forming the first-layer line, forming at least one shorting bar line in a region between two adjacent unit panel areas to be adjacent to the pad portion.

17. The method according to claim 16, wherein the first-layer line and the second-layer line are connected at respective first sides thereof to the plurality of data lines via pad electrodes and link lines in the mother substrate, and are connected at respective second sides opposite the respective first sides to the shorting bar line near the edge of each of the unit panel areas.

18. The method according to claim 16, further comprising:
when forming the second-layer line, forming second dummy patterns to overlap the shorting bar line.

19. The method according to claim 17, further comprising:
scribing the mother substrate in order to define each of the unit panel areas; and
bonding a plurality of printed circuit films to the pad portion of each of the unit panel areas to overlap the pad electrodes and to be spaced a first distance apart from the edge of each of the unit panel areas in the first direction, each of the printed circuit films having a drive Integrated Circuit (IC), the printed circuit films being spaced apart from each other at regular intervals in a second direction that intersects the first direction.

20. The method according to claim 18, wherein the forming the second-layer line comprises:
depositing a second-layer-line-forming material and coating a photosensitive film thereon;
sequentially performing an exposure process on the photosensitive film for the respective unit panel areas and areas near the unit panel areas using a mask;
forming a photosensitive film pattern by developing the photosensitive film; and
forming the second-layer line, the first connection pattern, the first dummy patterns and the second dummy patterns by removing the second-layer-line-forming material that is exposed through the photosensitive film pattern.

* * * * *